United States Patent
Campbell et al.

(10) Patent No.: US 9,167,721 B2
(45) Date of Patent: Oct. 20, 2015

(54) DIRECT FACILITY COOLANT COOLING OF A RACK-MOUNTED HEAT EXCHANGER

(75) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 644 days.

(21) Appl. No.: 13/305,937

(22) Filed: Nov. 29, 2011

(65) Prior Publication Data

US 2013/0133872 A1     May 30, 2013

(51) Int. Cl.
*H05K 7/20*     (2006.01)

(52) U.S. Cl.
CPC ........ *H05K 7/20281* (2013.01); *H05K 7/20781* (2013.01); *H05K 7/20836* (2013.01)

(58) Field of Classification Search
CPC ... F25D 17/02; F25D 31/002; F25B 2600/13; F24F 3/14; H05K 7/20281; H05K 7/20836; H05K 7/20781
USPC .................. 62/93, 295.1, 434, 435, 185, 201; 361/699, 700, 679.46
See application file for complete search history.

(56) References Cited

U.S. PATENT DOCUMENTS

| | | | |
|---|---|---|---|
| 4,512,161 A | | 4/1985 | Logan et al. |
| 5,139,549 A | * | 8/1992 | Knodel et al. .................. 62/532 |
| 5,144,811 A | | 9/1992 | Brodie et al. |

(Continued)

FOREIGN PATENT DOCUMENTS

| | | |
|---|---|---|
| EP | 1 788 328 A2 | 5/2007 |
| EP | 2 053 911 A2 | 4/2009 |

OTHER PUBLICATIONS

Campbell et al., Combined Search & Examination Report for GB 1221080.3, dated Mar. 8, 2013.

(Continued)

*Primary Examiner* — Allana Bidder
*Assistant Examiner* — Kun Kai Ma
(74) *Attorney, Agent, or Firm* — Steven Chiu, Esq.; Kevin P. Radigan, Esq.; Heslin Rothenberg Farley & Mesiti P.C.

(57) ABSTRACT

A cooling apparatus and method are provided. The cooling apparatus includes a coolant-cooled heat exchanger for facilitating dissipation of heat generated within an electronics rack, and a coolant control apparatus. The coolant control apparatus includes at least one coolant recirculation conduit coupled in fluid communication between a facility coolant supply and return, wherein the facility coolant supply and return facilitate providing facility coolant to the heat exchanger. The control apparatus further includes a coolant pump(s) associated with the recirculation conduit(s) and a controller which monitors a temperature of facility coolant supplied to the heat exchanger, and redirects facility coolant, via the coolant recirculation conduit(s) and coolant pump(s), from the facility coolant return to the facility coolant supply to, at least in part, ensure that facility coolant supplied to the heat exchanger remains above a dew point temperature.

17 Claims, 12 Drawing Sheets

(56) References Cited

U.S. PATENT DOCUMENTS

| | | | |
|---|---|---|---|
| 5,540,555 A * | 7/1996 | Corso et al. ................ 417/44.2 |
| 5,806,763 A * | 9/1998 | Jones ......................... 236/44 C |
| 6,045,331 A * | 4/2000 | Gehm et al. ..................... 417/2 |
| 7,385,810 B2 | 6/2008 | Chu et al. |
| 7,788,941 B2 | 9/2010 | Campbell et al. |
| 7,905,096 B1 | 3/2011 | Campbell et al. |
| 7,957,132 B2 | 6/2011 | Fried |
| 2002/0112636 A1* | 8/2002 | Desaulniers et al. ......... 101/487 |
| 2004/0020225 A1 | 2/2004 | Patel et al. |
| 2005/0086958 A1 | 4/2005 | Walsh |
| 2006/0010893 A1 | 1/2006 | Dominguez |
| 2006/0086112 A1* | 4/2006 | Bloemer et al. ............. 62/176.6 |
| 2007/0125107 A1* | 6/2007 | Beam ............................... 62/186 |
| 2008/0002364 A1 | 1/2008 | Campbell et al. |
| 2008/0310112 A1 | 12/2008 | Long et al. |
| 2009/0201645 A1* | 8/2009 | Kashirajima et al. ......... 361/700 |
| 2010/0078160 A1 | 4/2010 | Novotny et al. |
| 2010/0096109 A1* | 4/2010 | Zhang et al. ............. 165/104.19 |
| 2010/0236772 A1* | 9/2010 | Novotny et al. .............. 165/287 |
| 2010/0263855 A1 | 10/2010 | Arimilli et al. |
| 2010/0290190 A1 | 11/2010 | Chester et al. |
| 2010/0305775 A1 | 12/2010 | Bean, Jr. et al. |
| 2010/0314094 A1* | 12/2010 | Hall .............................. 165/293 |
| 2011/0063792 A1* | 3/2011 | Schmidt et al. .......... 361/679.46 |
| 2011/0100618 A1 | 5/2011 | Carlson |
| 2011/0105010 A1 | 5/2011 | Day |
| 2013/0133873 A1 | 5/2013 | Campbell et al. |

OTHER PUBLICATIONS

"SHTxx: Humidity & Temperature Sensmitter—Application Note Dew-Point Calculation", Sensirion, Inc., www.sensirion.com/humidity, pp. 1-3 (Nov. 18, 2001).

Campbell et al., Examination Report for GB 1221080.3, dated Dec. 2, 2013 (2 pages).

Campbell et al., Office Action for U.S. Appl. No. 13/706,568, filed Dec. 6, 2012 (U.S. Patent Publication No. 2013/0133873 A1), dated Jan. 29, 2015 (9 pages).

Campbell et al., Office Action for U.S. Appl. No. 13/706,568, filed Dec. 6, 2012 (U.S. Patent Publication No. 2013/0133873 A1), dated Aug. 12, 2015 (10 pages).

\* cited by examiner

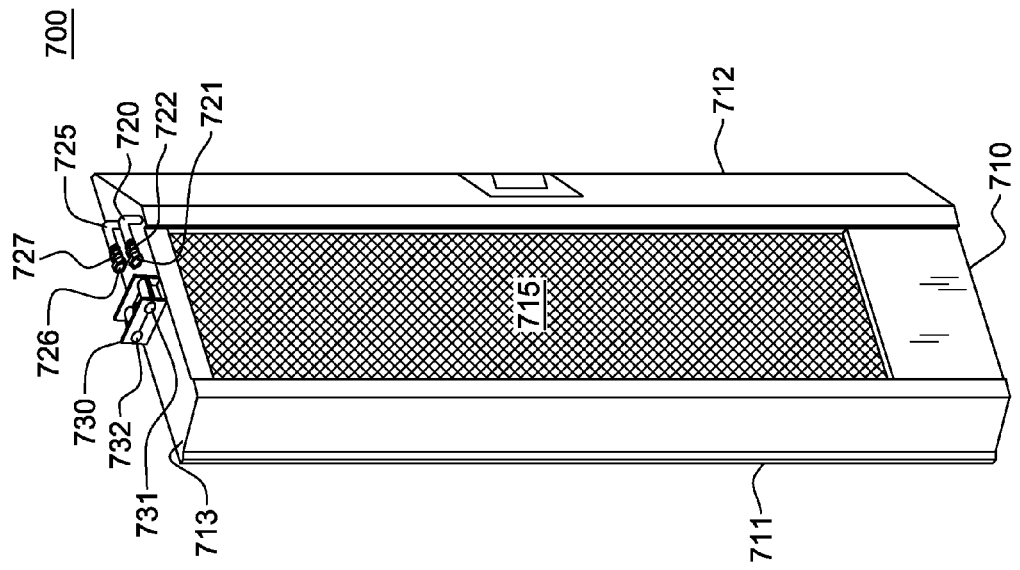
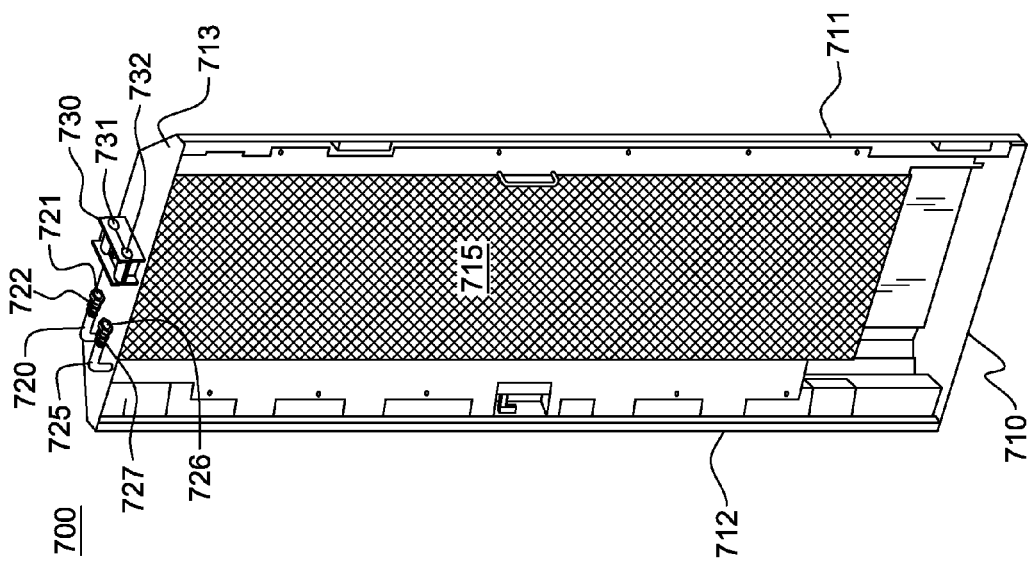
FIG. 7A
FIG. 7B

US 9,167,721 B2

DIRECT FACILITY COOLANT COOLING OF A RACK-MOUNTED HEAT EXCHANGER

BACKGROUND

The power dissipation of integrated circuit chips, and the modules containing the chips, continues to increase in order to achieve increases in processor performance. This trend poses a cooling challenge at both module and system levels. Increased airflow rates are needed to effectively cool high-powered modules, and to limit the temperature of the air that is exhausted into the computer center.

In many large server applications, processors, along with their associated electronics (e.g., memory, disk drives, power supplies, etc.), are packaged in removable drawer configurations stacked within a rack or frame. In other cases, the electronics may be in fixed locations within the rack or frame. Typically, the components are cooled by air moving in parallel airflow paths, usually front-to-back, impelled by one or more air-moving devices (e.g., fans or blowers). In some cases, it may be possible to handle increased power dissipation within a single drawer by providing greater airflow, through the use of a more powerful air-moving device, or by increasing the rotational speed (i.e., RPMs) of an existing air-moving device. However, this approach is becoming problematic at the rack level in the context of a computer installation (i.e., data center).

The sensible heat load carried by the air exiting the rack is stressing the capability of the room air-conditioning to effectively handle the load. This is especially true for large installations with "server farms", or large banks of computer racks close together. In such installations, liquid-cooling (e.g., water-cooling) is an attractive technology to manage the higher heat fluxes. The liquid absorbs the heat dissipated by the components/modules in an efficient manner. Typically, the heat is ultimately transferred from the liquid to an outside environment, whether to air or other liquid.

BRIEF SUMMARY

The shortcomings of the prior art are overcome and additional advantages are provided through the provision of a cooling apparatus, which includes a coolant-cooled heat exchanger and a coolant control apparatus. The heat exchanger is associated with an electronics rack and facilitates dissipation of heat generated within the electronics rack. The coolant control apparatus includes at least one coolant recirculation conduit, at least one coolant pump, and a controller. The at least one coolant recirculation conduit is coupled in fluid communication between a facility coolant supply conduit and a facility coolant return conduit, wherein the facility coolant supply conduit and the facility coolant return conduit facilitate a flow of facility coolant through the heat exchanger. The at least one coolant pump is associated with the at least one coolant recirculation conduit, and facilitates controlled recirculation of facility coolant from the facility coolant return conduit. The controller monitors temperature of facility coolant supplied to the heat exchanger, and controls the at least one coolant pump to control recirculation of facility coolant, via the at least one coolant recirculation conduit, from the facility coolant return conduit to the facility coolant supply conduit to, at least in part, ensure that facility coolant supplied to the air-to-liquid heat exchanger remains above a dew point temperature.

In another aspect, a cooled electronic system is provided which includes an electronics rack and a cooling apparatus. The electronics rack comprises an air inlet side and an air outlet side, wherein air passes through the electronics rack from the air inlet side to the air outlet side thereof. The cooling apparatus includes an air-to-liquid heat exchanger associated with the electronics rack for cooling air passing through the electronics rack, and a coolant control apparatus. The coolant control apparatus includes at least one coolant recirculation conduit, at least one coolant pump, and a controller. The at least one coolant recirculation conduit is coupled in fluid communication between a facility coolant supply conduit and a facility coolant return conduit, wherein the facility coolant supply conduit and the facility coolant return conduit facilitate a flow of facility coolant through the air-to-liquid heat exchanger. The at least one coolant pump is associated with the at least one coolant recirculation conduit, and facilitates controlled recirculation of facility coolant from the facility coolant return conduit to the facility coolant supply conduit. The controller monitors temperature of facility coolant supplied to the air-to-liquid heat exchanger, and controls the at least one coolant pump to control recirculation of facility coolant, via the at least one coolant recirculation conduit, from the facility coolant return conduit to the facility coolant supply conduit to, at least in part, ensure that the facility coolant supplied to the air-to-liquid heat exchanger remains above a dew point temperature.

In a further aspect, a method of facilitating dissipating heat from an electronics rack is provided. The method includes: disposing a coolant-cooled heat exchanger within the electronics rack, the coolant-cooled heat exchanger facilitating dissipation of heat generated within the electronics rack; and providing a coolant control apparatus, the coolant control apparatus including at least one coolant recirculation conduit, at least one coolant pump, and a controller. The at least one recirculation conduit pipe is coupled in fluid communication between a facility coolant supply conduit and a facility coolant return conduit, wherein the facility coolant supply conduit and the facility coolant return conduit facilitate a flow of facility coolant through the air-to-liquid heat exchanger. The at least one coolant pump is associated with the at least one coolant recirculation conduit, and facilitates controlled recirculation of facility coolant directly from the facility coolant return conduit to the facility coolant supply conduit. The controller monitors a temperature of facility coolant supplied to the heat exchanger, and controls the at least one coolant pump to control recirculation of facility coolant, via the at least one coolant recirculation conduit, from the facility coolant return conduit to the facility coolant supply conduit to, at least in part, ensure that the facility coolant supplied to the heat exchanger remains above a dew point temperature.

In a yet further aspect, a method for dissipating heat from an electronics rack is provided. The method includes: controllably recirculating facility coolant through a coolant-cooled heat exchanger associated with the electronics rack, the controllably recirculating comprising recirculating facility coolant through at least one coolant recirculation conduit coupled in fluid communication between a facility coolant supply conduit and a facility coolant return conduit, the facility coolant supply conduit and the facility coolant return conduit facilitating a flow of facility coolant through the coolant-cooled heat exchanger; wherein the controllably recirculating comprises controlling at least one coolant pump associated with the at least one coolant recirculation conduit to facilitate controlled recirculation of facility coolant from the facility coolant return conduit to the facility coolant supply conduit through the at least one coolant recirculation conduit; and monitoring temperature of facility coolant supplied to the coolant-cooled heat exchanger and incrementally adjusting a flow control valve associated with the facility coolant supply conduit to incrementally increase or decrease cooled facility coolant flow from the facility coolant supply conduit through the coolant-cooled heat exchanger to, at least in part, ensure that the facility coolant supplied to the coolant-cooled heat exchanger remains above a dew point temperature, wherein the at least one coolant recirculation conduit couples in fluid communication with the facility coolant supply conduit between the flow control valve and an inlet to the coolant-cooled heat exchanger.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 7A & 7B depict interior and exterior views, respectively, of one embodiment of an electronics rack door having an air-to-liquid heat exchanger disposed therein, in accordance with one or more aspects of the present invention;

DETAILED DESCRIPTION

Figure 1:
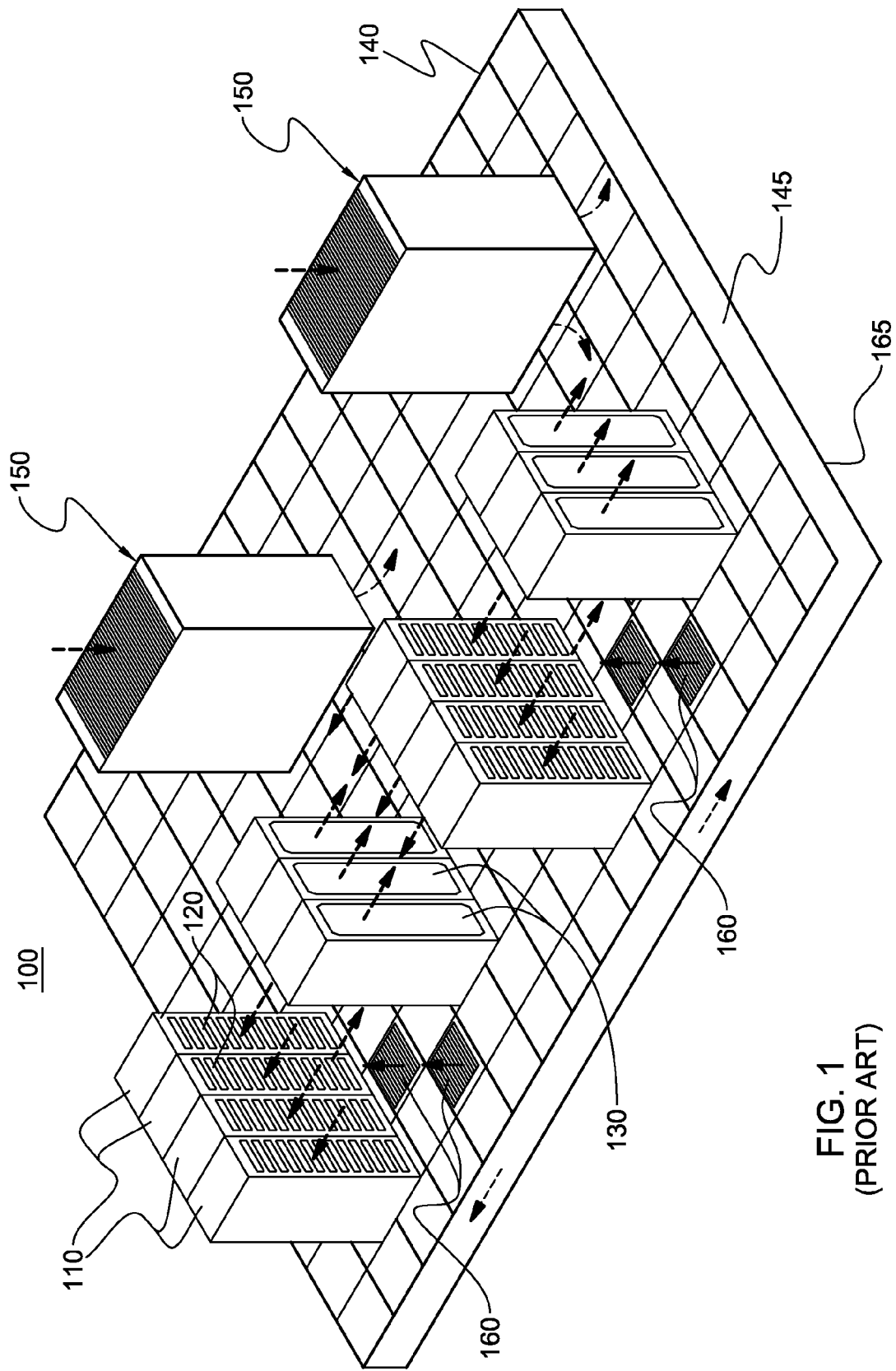
FIG. 1 depicts one embodiment of a raised floor layout of a computer installation capable of being retrofitted with one or more air-cooling apparatuses, in accordance with one or more aspects of the present invention.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand-alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with the rack-mounted electronic drawers of a multi-drawer rack unit and blades of a blade center system being two examples of systems (or subsystems) of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

As used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubings (such as copper or other tubing) in thermal or mechanical contact with a plurality of air-cooled cooling fins. Size, configuration and construction of the air-to-liquid heat exchanger can vary without departing from the scope of the invention disclosed herein. A "liquid-to-liquid heat exchanger" may comprise, for example, two or more coolant flow paths, formed of thermally conductive tubings (such as copper or other tubing) in thermal or mechanical contact with each other to facilitate conduction of heat therebetween. Size, configuration and construction of the liquid-to-liquid heat exchanger can vary without departing from the scope of the invention disclosed herein. Further, as used herein, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant, while still maintaining the advantages and unique features of the present invention. Note further that, as used herein, "facility coolant" refers to, for example, a chilled or cooled coolant (e.g., water or water with additives to prevent corrosion, freezing or biological growth) provided by the data center facility or building housing the data center.

Reference is made below to the drawings (which are not drawn to scale to facilitate understanding of the invention), wherein the same reference numbers used throughout different figures designate the same or similar components.

As shown in FIG. 1, in a raised floor layout of an air cooled computer installation or data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between a raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air-moving devices (e.g., fans or blowers) to provide forced inlet-to-outlet airflow to cool the electronic components within the rack. Supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more air-conditioning units 150, also disposed within data center 100. Room air is taken into each air-conditioning unit 150 near an upper portion thereof. This room air comprises in part exhausted air from the "hot" air aisles of the data center defined by opposing air outlet sides 130 of the electronics racks 110.

Due to the ever increasing airflow requirements through the electronics racks, and limits of air distribution within the typical computer room installation, recirculation problems within the room may occur. This recirculation can occur because the conditioned air supplied through the floor tiles may only be a fraction of the airflow rate forced through the electronics racks by the air moving devices disposed within the racks. This can be due, for example, to limitations on the tile sizes (or diffuser flow rates). The remaining fraction of the supply of inlet side air may be made up by ambient room air through recirculation, for example, from an air outlet side of a rack unit to an air inlet side. This recirculating flow is often very complex in nature, and can lead to significantly higher rack inlet temperatures than might be expected.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 15-32° C. range. For a raised floor layout such as depicted in FIG. 1, however, temperatures can range from 15-20° C. at the lower portion of the rack, close to the cool air floor vents, to as much as 32-42° C. at the upper portion of the electronics rack, where hot air can form a self-sustaining recirculation loop. Since the allowable rack heat load is limited by the rack inlet air temperature at the "hot" part, this temperature distribution correlates to an inefficient utilization of available air conditioning capability. Computer installation equipment almost always represents a high capital investment to the customer. Thus, it is of significant importance, from a product reliability and performance view point, and from a customer satisfaction and business perspective, to achieve a substantially uniform temperature across the air inlet side of the rack unit.

Figure 2:
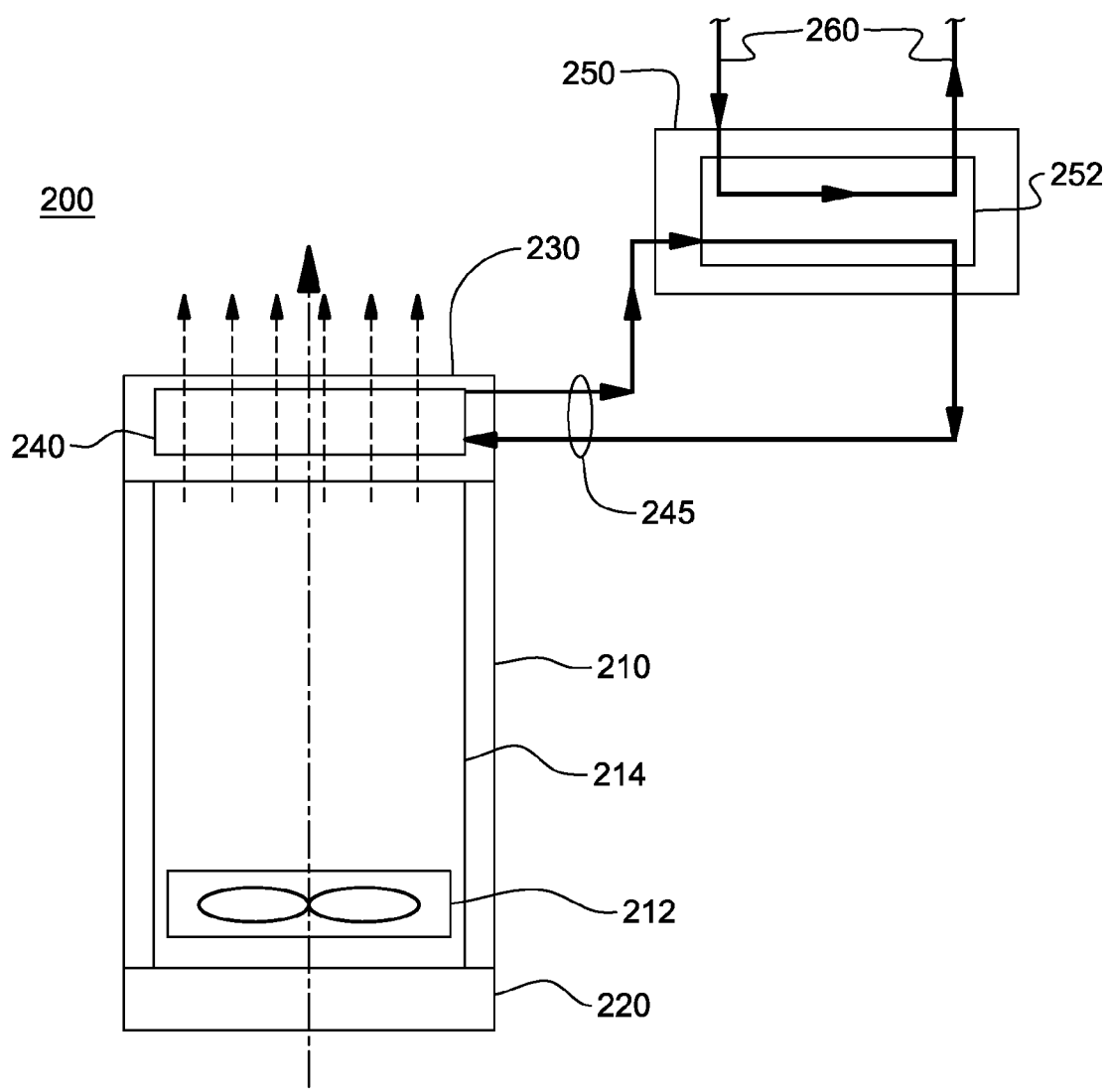
FIG. 2 is a top plan view of one embodiment of a single electronics rack with an air-to-liquid heat exchanger mounted to an outlet door thereof, and with extracted heat being rejected to facility coolant via a coolant distribution unit, in accordance with one or more aspects of the present invention.

FIG. 2 depicts one embodiment of a cooled electronic system, generally denoted 200. In this embodiment, electronic system 200 includes an electronics rack 210 having an inlet door 220 and an outlet door 230, which have openings to allow for the ingress and egress of external air, respectively, through the air inlet side and air outlet side of electronics rack 210. The system further includes at least one air-moving device 212 for moving external air across at least one electronic system or component 214 positioned within the electronics rack. Disposed within outlet door 230 is an air-to-liquid heat exchanger 240 across which the inlet-to-outlet airflow through the electronics rack passes. A coolant distribution unit 250 is used to buffer the air-to-liquid heat exchanger from facility coolant in a facility coolant loop. Air-to-liquid heat exchanger 240 removes heat from the exhausted inlet-to-outlet airflow through the electronics rack via circulating system coolant, for rejection in coolant distribution unit 250 to facility coolant in a facility coolant loop 260, that is, via a liquid-to-liquid heat exchanger 252 disposed therein. This cooling apparatus advantageously reduces heat load on existing air-conditioning units within the data center, and facilitates cooling of electronics racks by cooling the air egressing from the electronics rack and thus cooling any air recirculating to the air inlet side thereof.

As shown in FIG. 2, a system coolant loop 245 couples air-to-liquid heat exchanger 240 to coolant distribution unit 250. In one embodiment, the system coolant employed is water. By way of example, such a system is described in U.S. Pat. No. 7,385,810 B2, issued Jun. 10, 2008, and entitled "Apparatus and Method for Facilitating Cooling of an Electronics Rack Employing a Heat Exchange Assembly Mounted to an Outlet Door Cover of the Electronics Rack".

In one implementation, the inlet and outlet plenums of the air-to-liquid heat exchanger mount within the door and are coupled to coolant supply and return manifolds disposed beneath a raised floor. Alternatively, system coolant supply and return manifolds or headers for the air-to-liquid heat exchangers may be mounted above the electronics racks within the data center. In such an embodiment, system coolant enters and exits the respective coolant inlet and outlet plenums at the top of the rack door, using flexible coolant supply and return hoses, which are at least partially looped and are sized to facilitate opening and closing of the rack door (containing the air-to-liquid heat exchanger). Additionally, structures may be provided at the ends of the hoses to relieve stress at the hose ends, which results from opening or closing of the door.

Figure 3:
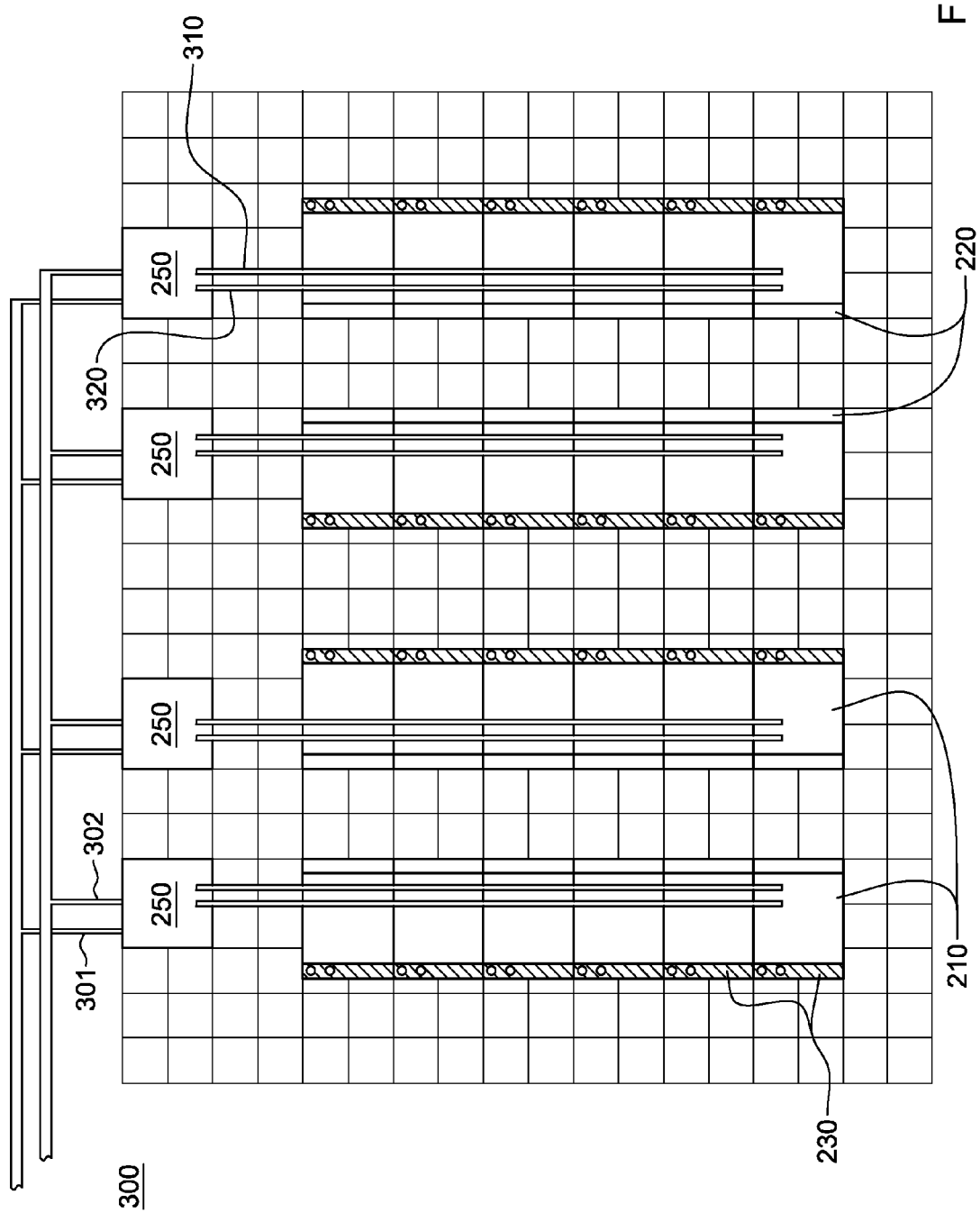
FIG. 3 depicts one embodiment of a data center layout comprising multiple coolant distribution units providing liquid coolant to a plurality of air-to-liquid heat exchangers associated with a plurality of electronics racks disposed in rows in the data center, and which is to be modified to include one or more air-cooling apparatuses, in accordance with one or more aspects of the present invention.

FIG. 3 is a plan view of one embodiment of a data center, generally denoted 300, employing cooled electronics systems. Data center 300 includes a plurality of rows of electronics racks 210, each of which includes an inlet door 220 at the air inlet side, and a hinged outlet door 230 at the air outlet side, such as described above in connection with the embodiment of FIG. 2. In this embodiment, each outlet door 230 supports an air-to-liquid heat exchanger and system coolant inlet and outlet plenums. Multiple coolant conditioning units 250, referred to hereinbelow as pumping units, are disposed within the data center (along with one or more air-conditioning units (not shown)). As shown, in one embodiment, each pumping unit forms a system coolant distribution subsystem with one row of a plurality of electronics racks. Each pumping unit includes a liquid-to-liquid heat exchanger where heat is transferred from a system coolant loop to a facility coolant loop. Chilled facility coolant, such as water, is received via facility coolant supply line 301, and is returned via facility coolant return line 302. System coolant, such as water, is provided via a system coolant supply header 310 extending over the respective row of electronics racks, and is returned via a system coolant return header 320 also extending over the respective row of electronics racks. In one embodiment, the system coolant supply and return headers 310, 320 are hard-plumbed within the data center, and preconfigured to align over and include branch lines extending towards electronics racks in a respective row of electronics racks.

Figure 4:
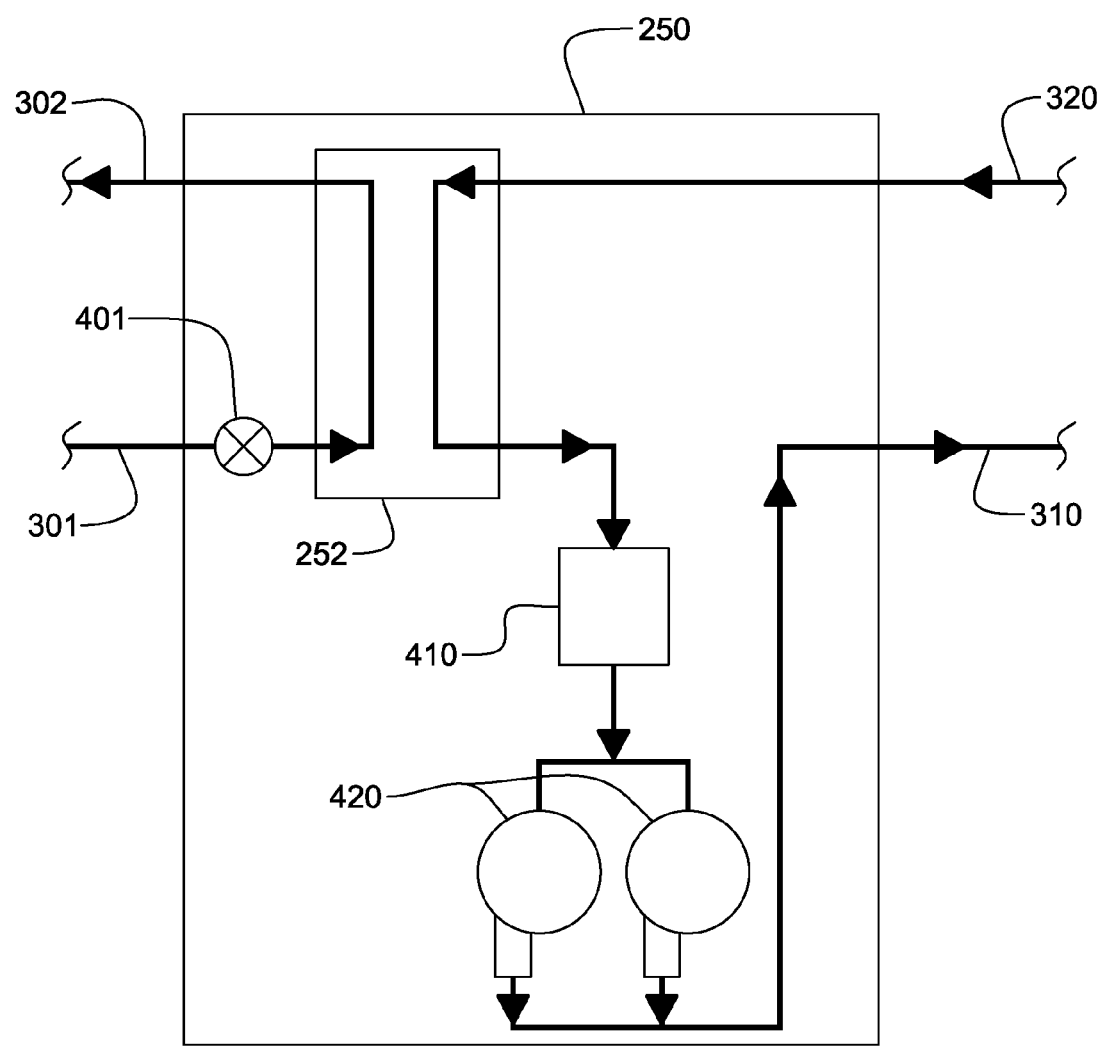
FIG. 4 is a schematic of one embodiment of a coolant distribution unit which may be employed (in one embodiment) in association with an air-cooling apparatus, in accordance with one or more aspects of the present invention.

FIG. 4 depicts one embodiment of a coolant distribution unit 250 for (for example) a data center such as depicted in FIG. 3. Liquid-to-liquid heat exchanger 252 cools system coolant passing through the system coolant loop (comprising system coolant supply header 310 and system coolant return header 320). In one embodiment, the system coolant has undergone heating (and possibly partial vaporization) within the respective air-to-liquid heat exchangers disposed within the outlet doors of the electronics racks. The facility coolant loop coupled to liquid-to-liquid heat exchanger 252 comprises facility coolant supply line 301 and facility coolant return line 302, which in one embodiment, provide chilled facility water to the liquid-to-liquid heat exchanger. A control valve 401 may be employed in facility coolant supply line 301 to control facility coolant flow rate through the liquid-to-liquid heat exchanger 252. After the system coolant cools within liquid-to-liquid heat exchanger 252, the coolant is collected in a reservoir 410 for pumping via a redundant pump assembly 420 back to the respective row of electronics racks via system coolant supply header 310.

Figure 5:
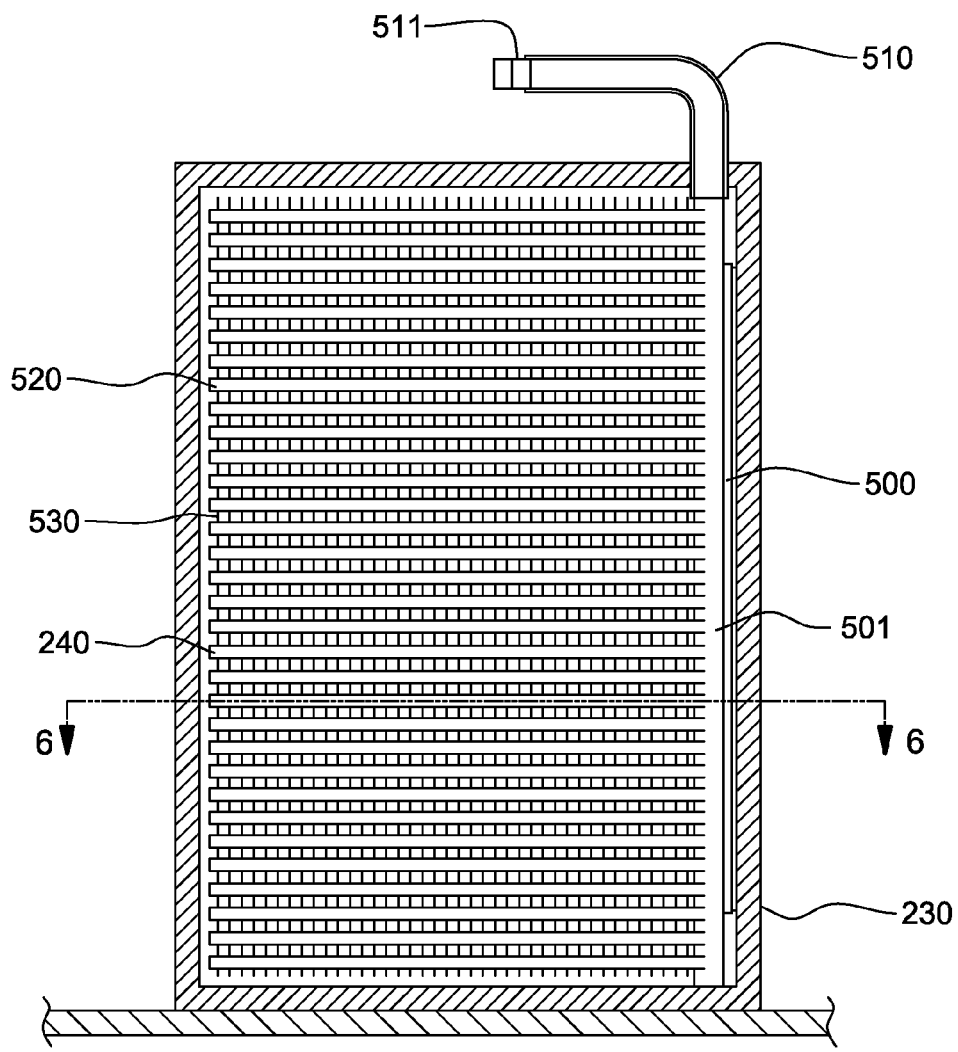
FIG. 5 is a partial cross-sectional elevational view of one embodiment of an electronic rack door with an air-to-liquid heat exchanger mounted thereto, taken along line 5-5 in FIG. 6, in accordance with one or more aspects of the present invention.
Figure 6:
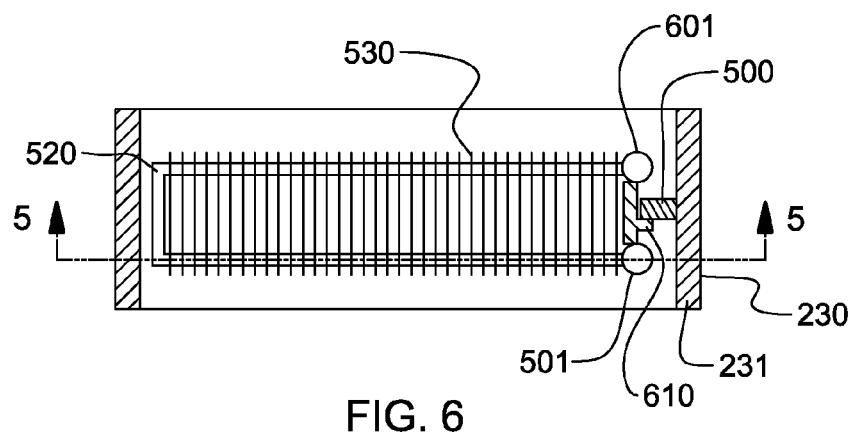
FIG. 6 is a cross-sectional, top plan view of the door and air-to-liquid heat exchanger of FIG. 5, taken along line 6-6 in FIG. 5, in accordance with one or more aspects of the present invention.

FIGS. 5 & 6 depict one embodiment of outlet door 230 supporting air-to-liquid heat exchanger 240, and system coolant inlet and outlet plenums 501, 601. Referring to both figures collectively, outlet door frame 231 supports a rigid flap 500, which attaches, for example, by brazing or soldering, to a plate 610 secured between the system coolant inlet plenum 501 and system coolant outlet plenum 601.

In FIG. 5, right angle bend 510 is shown disposed at the top of system coolant inlet plenum 501. This right angle bend defines a horizontal inlet plenum portion, which extends above the top of door 230. The coolant inlet to system coolant inlet plenum 501 is coupled to a connect coupling 511 for facilitating connection thereof to the respective supply hose, as described above. In this embodiment, the air-to-liquid heat exchanger comprises a plurality of horizontally-oriented heat exchange tube sections 520. These heat exchange tube sections 520 each comprise a coolant channel having an inlet and an outlet, with each coolant channel being coupled to the system coolant inlet plenum 501 and each coolant channel outlet being coupled to the system coolant outlet plenum 601. A plurality of fins 530 are attached to horizontally-oriented heat exchange tube sections 520 for facilitating transfer of heat from air passing across the air-to-liquid heat exchanger to coolant flowing through the plurality of heat exchange tube sections 520. In one embodiment, the plurality of fins are vertically-oriented, rectangular fins attached to horizontally-oriented heat exchange tube sections 520.

By way of specific example, FIGS. 7A & 7B depict one embodiment of an electronics rack door 700 with a cooling apparatus mounted thereto, which as explained below, may be configured and sized as a multi-rack door and heat exchanger, in accordance with one or more aspects of the present invention. This cooling apparatus includes an air-to-liquid heat exchanger 715 across which exhausting air from the air outlet side of the electronics rack(s) (not shown) flows. As illustrated, air-to-liquid heat exchanger 715 is disposed within an airflow opening in a door frame 710 which vertically mounts along a first edge 711 to the electronics rack(s) (or as explained below, an adapter frame holding multiple racks in fixed relation). The cooling apparatus includes a system coolant inlet plenum 720 and system coolant outlet plenum 725 which (in this embodiment) extend vertically into and along a second edge 712 of heat exchanger door 700. As illustrated, second edge 712 of heat exchanger door 700 is in opposing relation to first edge 711, which hingedly mounts to one or more electronics racks or adapter frames. Thus, in this embodiment, the system coolant inlet and outlet plenums 720, 725 are disposed remote from the edge of the heat exchanger door mounted to the electronics rack(s). This will advantageously reduce stress (in an overhead supply and return implementation) on the system coolant supply and return hoses, during opening or closing of the door, particularly when the first ends of the supply and return hoses are affixed in parallel relation on top of the rack door to extend towards the first edge of the rack door. As illustrated, system coolant inlet plenum 720 includes a coolant inlet 721 which has a connect coupling 722 for facilitating fluid tight connection to the system coolant supply hose (not shown). Similarly, system coolant outlet plenum 725 includes a coolant outlet 726 with a connect coupling 727 to facilitate fluid tight connection to a system coolant return hose. In one embodiment, these connect couplings are quick connect couplings such as the commercially available quick connect couplings offered by Colder Products Company, of St. Paul, Minn., U.S.A., or Parker Hannifin, of Cleveland, Ohio, U.S.A.

FIGS. 7A & 7B also illustrate one embodiment of a stress relief structure 730 attached to an upper surface 713 of door 700. Stress relief structure 730 includes a first opening 731 and a second opening 732 which are respectively configured to receive the system coolant supply hose and the system coolant return hose.

Figure 8:
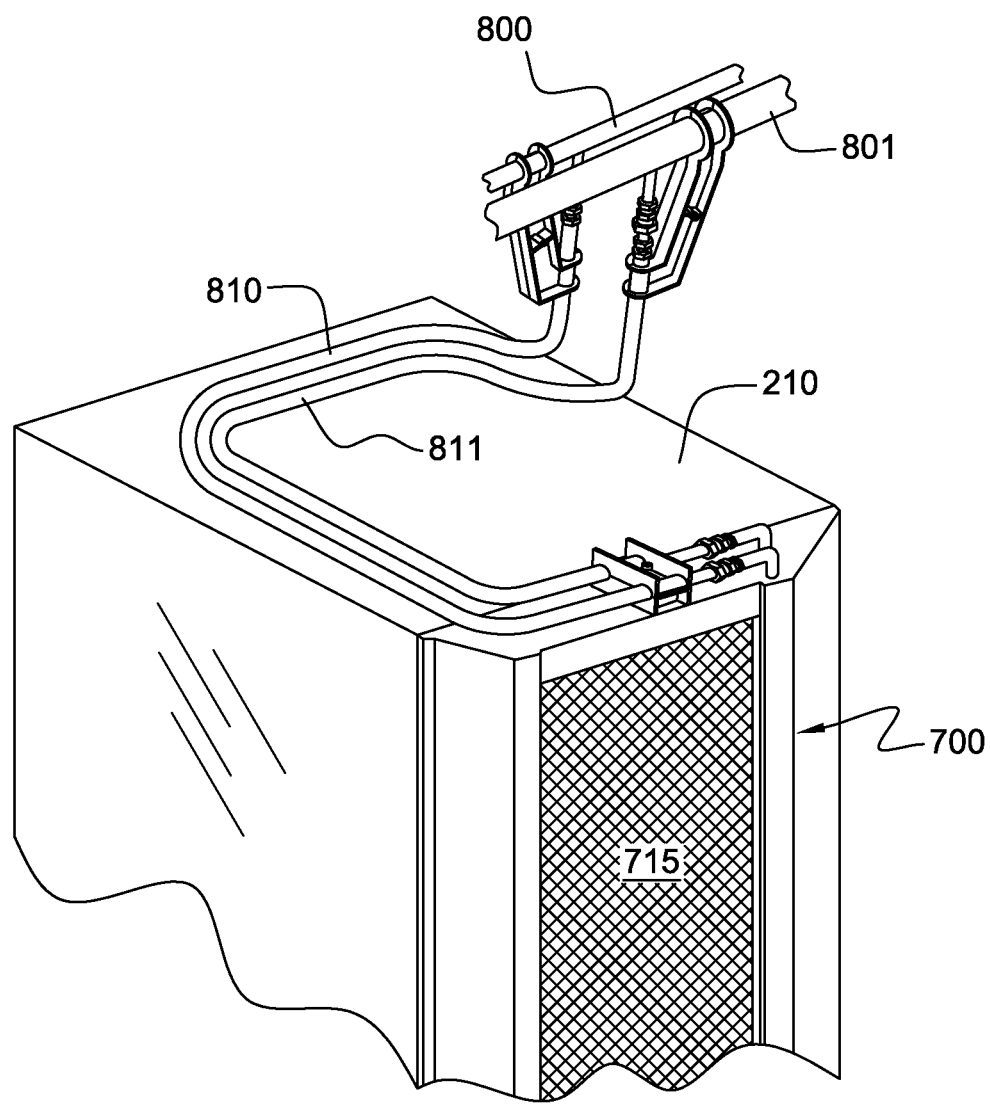
FIG. 8 is a partial isometric view of one embodiment of a single electronics rack, with an electronics rack door having an air-to-liquid heat exchanger, and illustrating one embodiment of coolant supply and return headers of a data center, in accordance with one or more aspects of the present invention.

FIG. 8 depicts one embodiment of electronics rack 210 comprising a hinged outlet door 700 with an air-to-liquid heat exchanger 715 disposed therein, and illustrating overhead system coolant supply and return headers 800, 801, respectively. As shown, system coolant supply and return hoses 810, 811 couple the air-to-liquid heat exchanger 715 in fluid communication with the system coolant supply and return headers 800, 801, respectively. In one embodiment, system coolant supply and return hoses 810, 811 are sufficiently sized to allow for translational and rotational movement of the hoses with opening or closing of the heat exchanger door 700. If desired, retention loops could be provided for constraining movement of the hoses at multiple locations on top of the electronics rack.

Figure 9A:
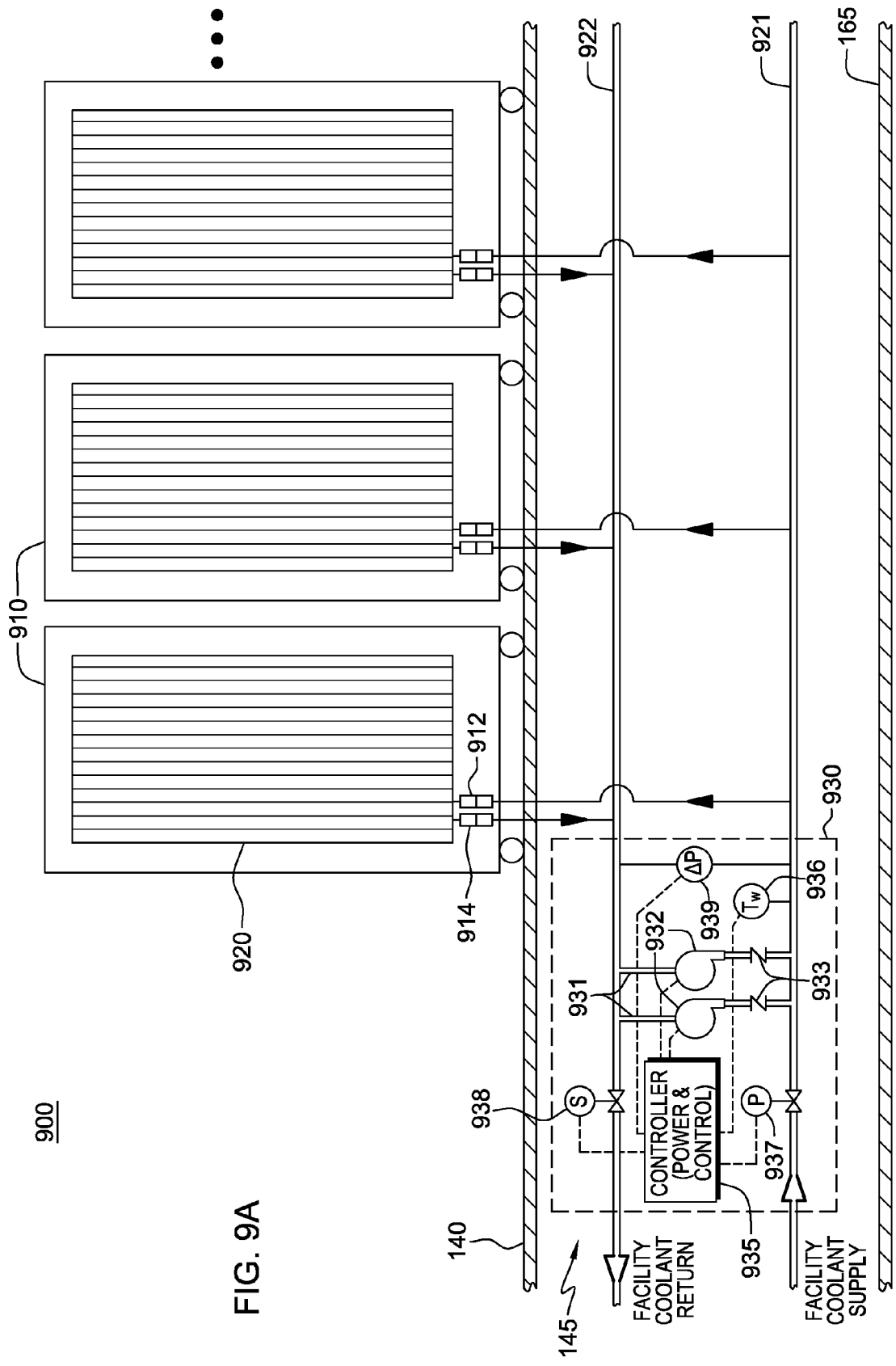
FIG. 9A depicts one embodiment of a data center comprising multiple electronics racks, each with one or more coolant-cooled heat exchangers associated therewith, and a shared coolant control apparatus coupled between facility coolant supply and return conduits, in accordance with one or more aspects of the present invention.
Figure 9B:
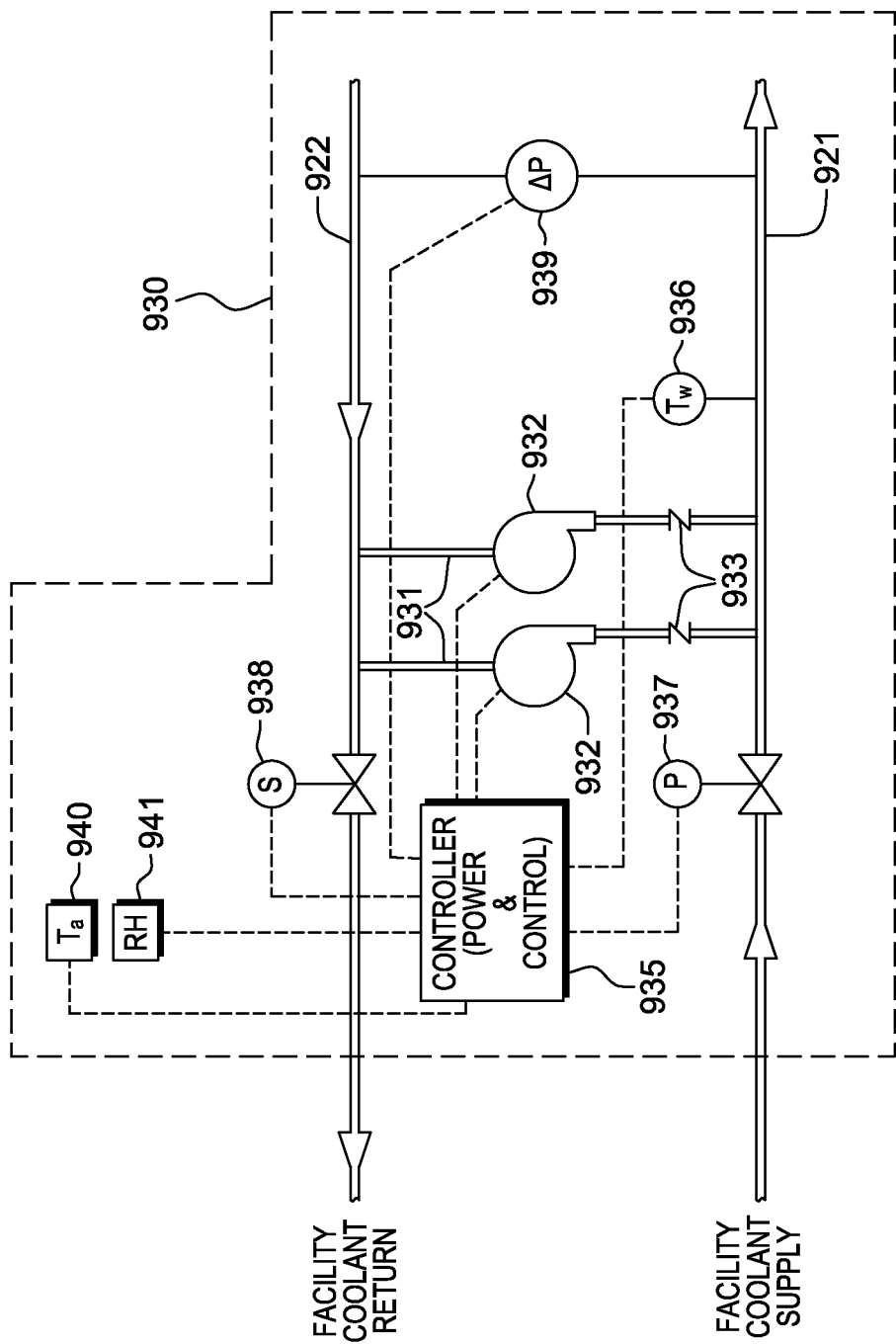
FIG. 9B is an enlarged view of the shared coolant control apparatus of FIG. 9A, in accordance with one or more aspects of the present invention.
Figure 9C:
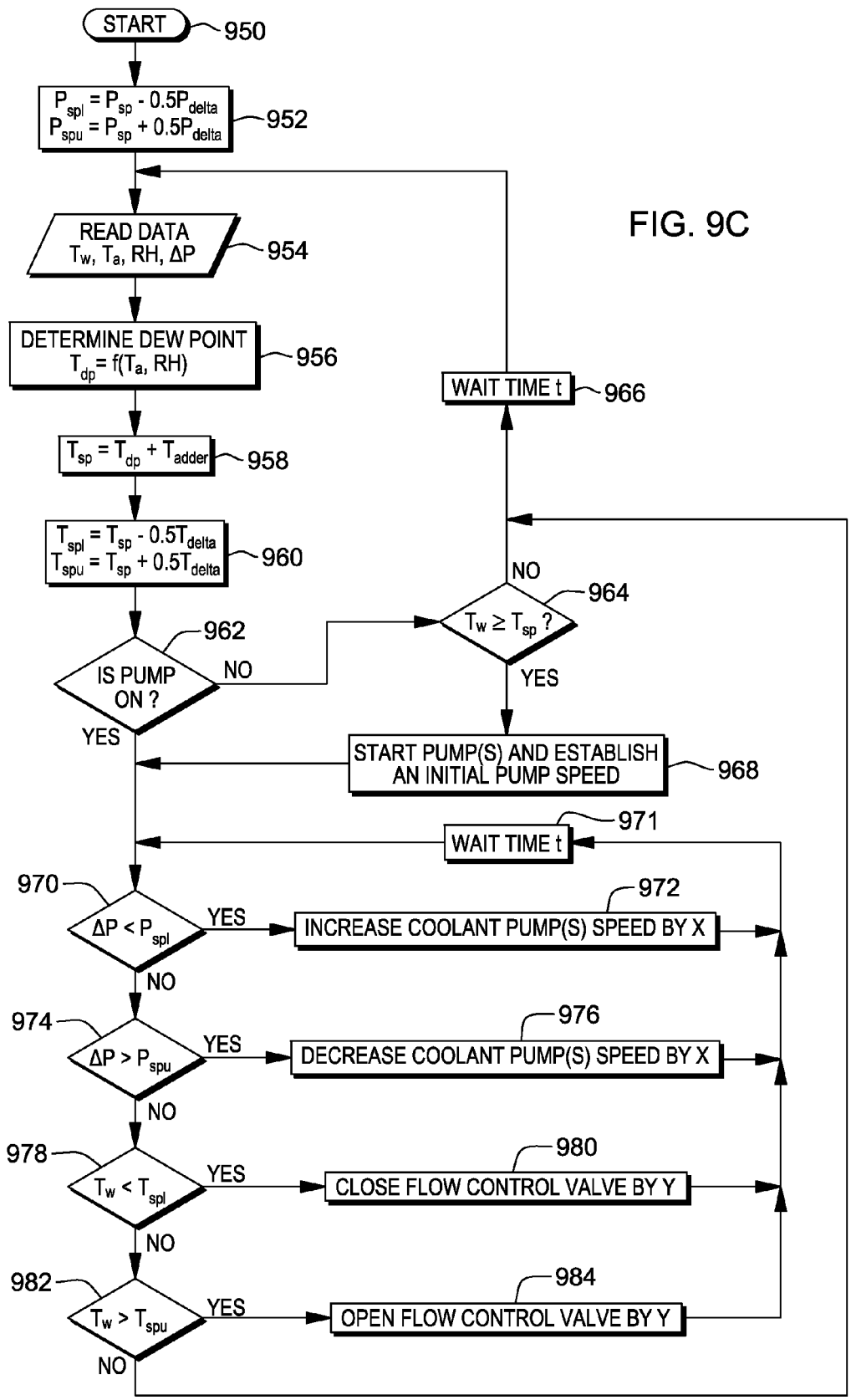
FIG. 9C depicts one embodiment of a process for controlling temperature and flow of facility coolant to a coolant-cooled heat exchanger employing the coolant control apparatus of FIGS. 9A & 9B, in accordance with one or more aspects of the present invention.

The above-described, door-mounted air-to-liquid heat exchanger, cooled by system coolant supplied by one or more coolant distribution units within the data center, can be advantageously employed to extract heat from air passing through one or more electronics racks of the data center. In FIGS. 9A-9C, an alternate implementation of a cooling apparatus comprising one or more coolant-cooled heat exchangers (such as one or more air-to-liquid heat exchangers) is depicted. As shown, each air-to-liquid heat exchanger is associated with an electronics rack of the data center, and coolant, such as water, is controllably fed directly to the air-to-liquid heat exchangers. That is, no coolant distribution unit such as described above is employed within the data center to buffer the facility coolant from the heat exchangers, nor is there a second, system coolant. Rather, the single facility coolant is directly employed within the heat exchangers to facilitate removal of heat generated within the electronics rack(s).

Generally stated, provided herein, in one aspect, is a cooling apparatus which includes one or more heat exchangers associated with an electronics rack and disposed to, for example, cool air passing through the electronics rack. In one implementation, the heat exchanger may comprise a door-mounted air-to-liquid heat exchanger at the air outlet side of the electronics rack. In an alternate implementation, the heat exchanger may comprise a liquid-cooled cold plate coupled to, for example, one or more heat-generating electronic components within the electronics rack. The cooling apparatus further includes a coolant control apparatus which includes at least one coolant recirculation conduit, at least one coolant pump, and a controller. The at least one coolant recirculation conduit is coupled in fluid communication between a facility coolant supply conduit and a facility coolant return conduit, wherein the facility coolant supply conduit and the facility coolant return conduit facilitate providing a flow of facility coolant to the heat exchanger. The coolant pump(s) is associated with the coolant recirculation conduit(s), and the coolant pump(s) facilitates controlled recirculation of facility coolant from the facility coolant return conduit to the facility coolant supply conduit, wherein facility coolant within the facility coolant supply conduit is at a higher pressure than facility coolant within the facility coolant return conduit. The controller monitors a temperature of the facility coolant at, for example, an inlet of the heat exchanger, and re-circulates the warmer facility coolant (via the at least one coolant recirculation conduit and coolant pump(s)) from the facility coolant return conduit to the facility coolant supply conduit to, at least in part, ensure that the temperature of facility coolant supplied to the heat exchanger remains above a current dew point temperature for the data center housing the electronics rack. Commensurate with this, the controller also controls a proportional valve coupled in fluid communication with the facility coolant supply conduit to control the chilled facility coolant flow provided for mixing with the re-circulated warm facility coolant, and thereby control the temperature of the facility coolant supplied to the heat exchanger. In one implementation, the controller monitors ambient air temperature and relative humidity of the ambient air, continually re-determines the dew point temperature and dynamically adjusts the warm facility coolant flow through the at least one coolant recirculation conduit and the chilled facility coolant flow through the facility coolant supply conduit to maintain facility coolant temperature at the inlet to the heat exchanger above the current dew point temperature.

FIGS. 9A-9C depict one embodiment of a cooled electronic system, in accordance with the above-summarized alternate implementation. As illustrated in FIG. 9A, the cooled electronic system resides within a data center 900, and comprises (in one embodiment) multiple electronics racks 910, such as the above-described electronics racks, which may be at least partially air-cooled, with air passing through each electronics rack from an air inlet side to an air outlet side thereof. In the illustrated embodiment, each electronics rack 910 comprises a heat exchanger 920, such as an air-to-liquid heat exchanger mounted within a door at the air inlet side or the air outlet side of the electronics rack. Respective quick connect couplings 912, 914 facilitate coupling heat exchangers 920 in fluid communication with a facility coolant supply conduit 921 and facility coolant return conduit 922. In one example, the supply and return conduits are disposed within the supply air plenum 145 defined between a raised floor 140 and base (or subfloor) 165 of data center 900. In addition to the heat exchanger(s) 920 associated with electronics rack(s) 910, the cooling apparatus further includes a coolant control apparatus 930. In this embodiment, the coolant control apparatus 930 is a shared coolant control apparatus disposed within the supply air plenum 145, and this single coolant control apparatus 930 controls temperature and flow of facility coolant to multiple heat exchangers 920 associated with multiple electronics racks 910 of the cooled electronic system. Note that in one or more alternate embodiments, multiple coolant control apparatuses 930 could be employed within a single data center to, at least in part, ensure that facility coolant supplied at the inlets to the heat exchangers remains above the room dew point temperature.

FIG. 9B is an enlarged view of the FIG. 9A embodiment of coolant control apparatus 930, which is shown to comprise, in one embodiment, multiple coolant recirculation conduits 931 coupled in fluid communication between facility coolant supply conduit 921 and facility coolant return conduit 922. One or more controllable coolant pump(s) 932 are associated with a respective coolant recirculation conduit 931 to facilitate control by a controller 935 of recirculation of warm facility coolant from the facility coolant return conduit 922 to the facility coolant supply conduit 921 as needed to ensure that facility coolant supplied to the inlets of the heat exchangers remains above current room dew point temperature. More particularly, a fraction (between zero and 1, inclusive) of the facility coolant may be pumped back to the facility coolant supply conduit via the coolant pump(s). This fraction of coolant essentially re-circulates through the heat exchangers. At least one temperature sensor ($T_w$) 936 is disposed between the recirculation pumps and the heat exchangers, and serves to establish the temperature of the facility coolant entering the heat exchangers. It is this temperature that is used to control operation of the valves and pumps of the control apparatus to, at least in part, ensure that the coolant going through the heat exchangers is above the dew point sensed and determined from ambient air temperature and relative humidity measurements within the data center.

Each coolant recirculation conduit 931 further includes a check valve 933 to prevent backflow of facility coolant from the higher-pressure facility coolant supply conduit 921 towards the lower-pressure facility coolant return conduit 922. The coolant control apparatus also includes (in one embodiment) a two-way, proportional flow control valve 937, a solenoid shutoff valve 938, and a differential pressure sensor 939, in addition to an ambient air temperature sensor ($T_a$) 940 and an ambient air relative humidity sensor (RH) 941. Each of these sensors and valves is coupled to controller 935, which automatically controls the temperature and flow of facility coolant to the heat exchangers, in accordance with processing implemented by the controller, such as the processing depicted in FIG. 9C, and described below.

Note that the hardware and controls illustrated in FIGS. 9A & 9B are depicted underneath the raised floor in the vicinity of the electronics racks, by way of example only. Also, note that the room ambient and relative humidity sensors may be part of the data center or part of the electronics rack infrastructure.

In one start up embodiment, the flow control proportional and shutoff valves 937, 938, are closed initially, preventing chilled coolant flow through the heat exchangers. At this start up stage, the controller does not permit the valves to open, nor the coolant pumps to start until the sensed facility coolant temperature ($T_w$) is above ambient dew point ($T_{dp}$). The pumps are then turned on, and the coolant will rise in temperature as it heats up from operation of the heat exchangers, and when the temperature of the facility coolant reaches a predetermined set point, the solenoid shutoff valve 938 is opened, and the proportional valve 937 is controlled to allow the colder facility coolant provided via the facility coolant source (not shown), to mix with the facility coolant recirculating through the heat exchangers. The flow control proportional valve 937 will allow more or less of the colder facility coolant to mix with the recirculating facility coolant provided back to the heat exchangers in order to, for example, maintain the facility coolant at the inlets to the heat exchangers within a desired set point temperature range.

As noted, FIG. 9C depicts one embodiment of a process for controlling temperature and flow of facility coolant employing a cooling apparatus comprising a heat exchanger and a coolant control apparatus, such as described above in connection with FIGS. 9A & 9B. Variables employed in the processing set out in FIG. 9C are defined in Table 1 below.

TABLE 1

| Variable | Definition |
| --- | --- |
| $P_{sp}$ | Nominal pressure differential set point. |
| $P_{delta}$ | Pressure differential set point tolerance. |
| $P_{spl}$ | Lower pressure differential set point. |
| $P_{spu}$ | Upper pressure differential set point. |
| $T_w$ | Coolant temperature (to heat exchanger). |
| $T_a$ | Room ambient (air) temperature. |
| RH | Relative Humidity. |
| $\Delta P$ | Pressure differential (supply − return). |
| $T_{dp}$ | Dew point temperature. |
| $T_{sp}$ | Nominal set point temperature. |
| $T_{adder}$ | Temperature adder to assure $T_w$ is above dew point. |
| $T_{spl}$ | Lower temperature set point. |
| $T_{spu}$ | Upper temperature set point. |
| $T_{delta}$ | Temperature set point tolerance. |

Upon initiating control processing 950, the controller determines a lower pressure differential set point ($P_{spl}$) and an upper pressure differential set point ($P_{spu}$) employing a pressure differential set point tolerance ($P_{delta}$) about a nominal pressure differential set point ($P_{sp}$) 952. The controller then reads coolant (e.g., water) temperature ($T_w$), room ambient air temperature ($T_a$), relative humidity (RH), and the pressure differential ($\Delta P$) measured between the facility coolant supply and facility coolant return conduits 954. The controller then determines a current dew point temperature ($T_{dp}$) 956. Note that one skilled in the art can readily determine the dew point temperature ($T_{dp}$) from the ambient air temperature ($T_a$) and relative humidity (RH).

After determining the dew point temperature ($T_{dp}$), the controller ascertains a nominal temperature set point ($T_{sp}$) by adding a tolerance, referred to as a temperature adder ($T_{adder}$), to the nominal set point temperature ($T_{sp}$) to assure that the facility coolant remains above the dew point temperature ($T_{dp}$) 958. Processing then determines a lower temperature set point ($T_{spl}$) and an upper temperature set point ($T_{spu}$) employing a temperature set point tolerance ($T_{delta}$) about the nominal temperature set point ($T_{sp}$), as illustrated 960.

Next, the controller determines whether the coolant pump (s) is ON 962, and if "no", ascertains whether coolant temperature ($T_w$) to the heat exchanger is greater than or equal to the nominal temperature set point ($T_{sp}$) 964. If "no", then processing waits a time interval (t) 966 before again reading the coolant temperature ($T_w$), room ambient air temperature ($T_a$), relative humidity (RH), and pressure differential ($\Delta P$) 954. If the coolant temperature ($T_w$) at the heat exchanger inlet is greater than or equal to the nominal set point temperature ($T_{sp}$), then the controller begins recirculation of facility coolant by starting the coolant pump(s) and establishing an initial pump speed 968.

Processing next determines whether the pressure differential ($\Delta P$) is less than the lower pressure differential set point ($P_{spl}$) 970. If "yes", then the controller increases the coolant pump(s) speed incrementally by X RPMs 972, and waits a time interval (t) 971 before looping back to determine whether the pressure differential ($\Delta P$) is less than the lower pressure differential set point ($P_{spl}$). If the pressure differential ($\Delta P$) is at or above the lower pressure differential set point ($P_{spl}$), then processing determines whether the pressure differential ($\Delta P$) is greater than the upper pressure differential set point ($P_{spu}$) 974, and if "yes", automatically decreases the coolant pump(s) speed incrementally by X RPMs 976, before waiting time interval (t) 971, and looping back to reevaluate the pressure differential ($\Delta P$) relative to the lower ($P_{spl}$) and upper ($P_{spu}$) pressure differential set points.

Assuming that the pressure differential ($\Delta P$) is within the lower and upper pressure differential set points, then processing determines whether the coolant temperature ($T_w$) is less than the lower temperature set point ($T_{spl}$) 978, and if "yes", processing closes the flow control valve (e.g., a proportional valve) associated with the facility coolant supply conduit by an increment Y 980, before waiting time interval (t) to reevaluate the pressure differential ($\Delta P$) and coolant temperature ($T_w$) relative to the respective lower and upper set points.

Assuming that the coolant temperature ($T_w$) is at or above the lower temperature set point ($T_{spl}$), then processing determines whether the coolant temperature ($T_w$) is greater than the upper temperature set point ($T_{spu}$), and if "yes", processing opens the flow control valve, for example, by increment Y 984, before waiting time interval (t) 971, and reevaluating the pressure differential ($\Delta P$) and coolant temperature ($T_w$) relative the respective lower and upper set points.

Assuming that the pressure differential ($\Delta P$) and coolant temperature ($T_w$) are within their respective set points, then processing waits time interval t 966 before again reading the coolant temperature ($T_w$), ambient air temperature ($T_a$), relative humidity (RH), and ascertaining the differential pressure ($\Delta P$) 954. Note that the time interval for wait time t 966 may be the same or different from the time interval for wait time t 971.

Figure 10:
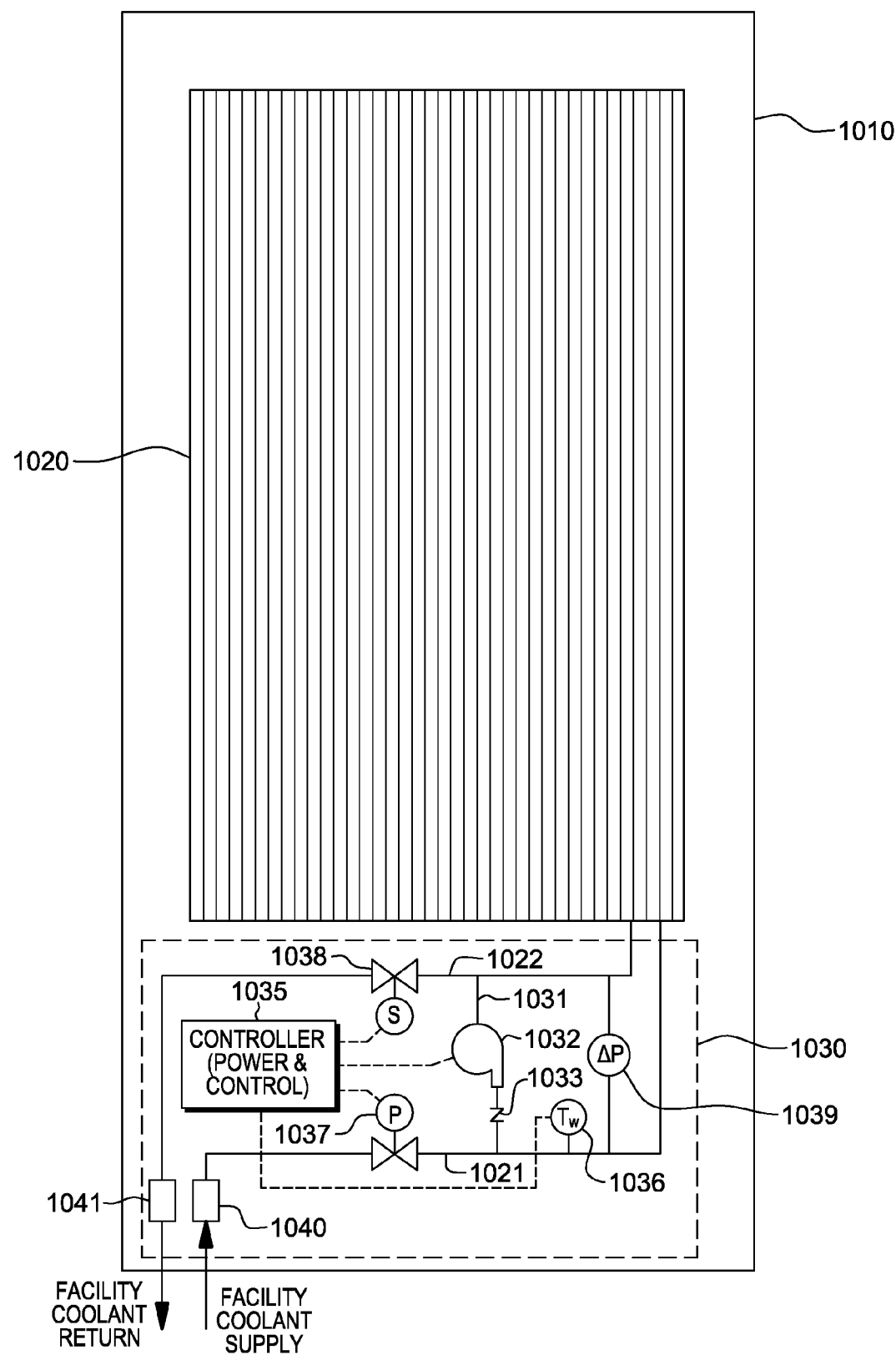
FIG. 10 depicts an alternate embodiment of a cooling apparatus comprising a coolant-cooled heat exchanger mounted within an electronics rack and a coolant control apparatus, similar to the coolant control apparatus described above in connection with FIGS. 9A-9C, in accordance with one or more aspects of the present invention.

FIG. 10 depicts an alternate embodiment of a cooling apparatus, in accordance with one or more aspects of the present invention. In this embodiment, the cooling apparatus includes a heat exchanger 1020 (such as an air-to-liquid heat exchanger) associated with an electronics rack 1010 and disposed for cooling air passing through the electronics rack. In one implementation, the air-to-liquid heat exchanger 1020 is disposed within a door at an air inlet side or an air outlet side of the electronics rack. Also disposed within the electronics rack or, for example, within the door housing the air-to-liquid heat exchanger, is a coolant control apparatus 1030, similar to the coolant control apparatus described above in connection with FIGS. 9A-9C. As shown, coolant control apparatus 1030 is dedicated to the particular electronics rack and is coupled between a facility coolant supply conduit 1021 and a facility coolant return conduit 1022, which are respectively coupled in fluid communication via quick connects 1040, 1041 with a facility coolant supply header and facility coolant return header disposed, for example, below a raised floor of the data center, and facilitating flow of facility coolant through one or more electronics racks of the data center.

Coolant control apparatus 1030 includes one or more coolant recirculation conduits 1031 coupled in fluid communication between facility coolant supply conduit 1021 and facility coolant return conduit 1022. One or more coolant pump(s) 1032 are associated with the one or more coolant recirculation conduit(s) 1031 to facilitate control by a controller 1035 of recirculation of warm facility coolant from the facility coolant return conduit 1022 to the facility coolant supply conduit 1021 to, at least in part, ensure that the facility coolant supplied to inlet of the heat exchanger 1020 remains above room dew point temperature. As explained above, a fraction of the facility coolant may be pumped back to the facility coolant supply conduit via the coolant pump(s), and this fraction of coolant essentially re-circulates through the heat exchanger. A temperature sensor ($T_w$) 1036 is disposed between the recirculation pump and the heat exchanger within the facility coolant supply conduit 1021, and serves to establish the temperature of the facility coolant entering the heat exchanger. This temperature is then employed in a control operation to control the valves and pumps of the coolant control apparatus to ensure that the coolant going to the heat exchanger remains above the dew point determined from the ambient air and relative humidity measurements made within the data center.

As explained above, the coolant recirculation conduit 1031 further includes a check valve 1033 to prevent backflow of facility coolant from the higher-pressure facility coolant supply conduit 1021 towards the lower-pressure facility coolant return conduit 1022. The coolant control apparatus also includes a two-way, proportional control valve 1037, a solenoid shut off valve 1038, and a differential pressure sensor 1039, in addition to the ambient air temperature sensor ($T_a$) (not shown) and the ambient air relative humidity sensor (RH) (not shown). Each of these sensors and valves are coupled to controller 1035, which automatically controls the temperature and flow of facility coolant to the heat exchanger(s), for example, in accordance with a process such as described above in connection with FIG. 9C.

As with the shared coolant control apparatus embodiment of FIGS. 9A-9C, in one start up embodiment, the flow control (proportional) and shut off valves 1037, 1038 are initially closed, preventing facility coolant flow into the heat exchanger. At the start up stage, the controller does not permit the valves to open, nor the coolant pump to start until the sensed facility coolant temperature ($T_w$) is above the ambient dew point ($T_{dp}$). The pump(s) is then turned on, and the coolant rises in temperature as it heats in the heat exchangers, and when the temperature of the facility coolant reaches a predetermined set point, the solenoid shut off valve 1038 is opened, and the proportional valve 1037 is controlled to allow the colder facility coolant provided via the facility coolant source (not shown) to mix with any facility coolant recirculating through the heat exchanger. The flow control valve 1037 allows the controller to adjust the amount of the colder facility coolant to mix with the recirculating facility coolant provided back to the heat exchanger, thereby allowing the controller to maintain the facility coolant at the inlet to the heat exchanger within the desired set point temperature range.

Those skilled in the art will note from the above discussion that provided herein is a cooling apparatus which enables the direct use of facility coolant, such as building-chilled water, within a heat exchanger associated with an electronics rack, such as an air-to-liquid heat exchanger mounted to the air outlet side of the rack. The cooling apparatus disclosed herein assures that the coolant entering the heat exchanger is above the room dew point, with fewer components than a conventional computer room water-conditioner (CRWC) or coolant distribution unit (CDU), resulting in a lower capital implementation cost.

As will be appreciated by one skilled in the art, control aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, control aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable signal medium may be any non-transitory computer readable medium that is not a computer readable storage medium and that can communicate, propagate, or transport a program for use by or in connection with an instruction execution system, apparatus or device.

A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 11:
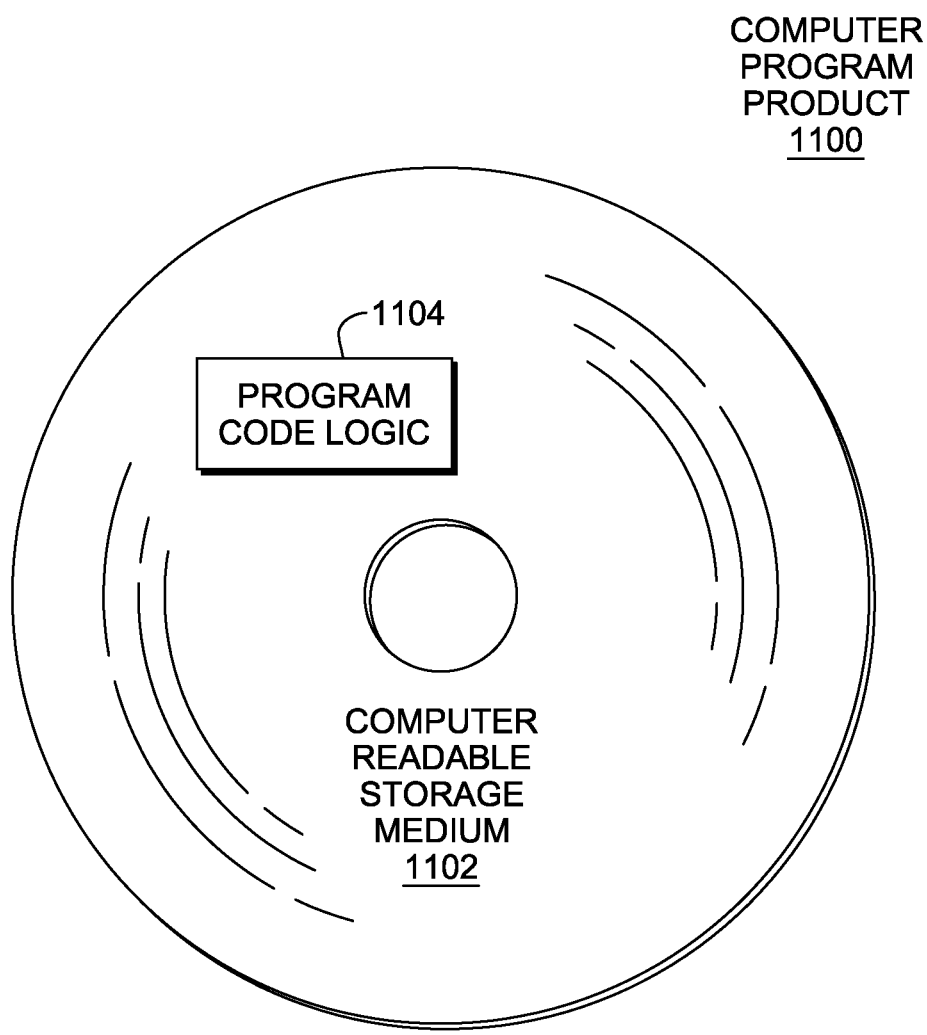
FIG. 11 depicts one embodiment of a computer program product or a computer-readable storage medium incorporating one or more aspects of the present invention.

Referring now to FIG. 11, in one example, a computer program product 1100 includes, for instance, one or more computer readable storage media 1102 to store computer readable program code means or logic 1104 thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. For example, computing environments of other architectures can incorporate and use one or more aspects of the present invention. Additionally, the network of nodes can include additional nodes, and the nodes can be the same or different from those described herein. Also, many types of communications interfaces may be used.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A cooling apparatus comprising:
A coolant-cooled heat exchanger associated with an electronic rack and facilitating dissipation of heat generated within the electronics rack; and
a coolant control apparatus, the coolant control apparatus comprising:
   at least one coolant recirculation conduit coupled in fluid communication between a facility coolant supply conduit and a facility coolant return conduit, the facility coolant supply conduit facilitating a flow of liquid facility coolant to the coolant-cooled heat exchanger and the facility coolant return conduit facilitating exhausting the liquid facility coolant from the coolant-cooled heat exchanger;
   at least one liquid coolant pump associated with the at least one coolant recirculation conduit, the at least one liquid coolant pump facilitating controlled recirculation of liquid facility coolant from the facility coolant return conduit to the facility coolant supply conduit through the at least one coolant recirculation conduit;
   at least one check valve whining the at least one coolant recirculation conduit, the at least one check valve preventing backflow of the liquid facility coolant from the facility coolant supply conduit to the facility coolant return conduit through the at least one recirculation conduit; and
   a controller, the controller monitoring a temperature of the liquid facility coolant supplied to the coolant-cooled heat exchanger, and controlling the at least one liquid coolant pump to control recirculation of the liquid facility coolant, via the at least one coolant recirculation conduit, from the facility coolant return conduit to the facility coolant supply conduit to, at least in part, ensure that the liquid facility coolant supplied to the coolant-cooled heat exchanger remains above a dew point temperature.

2. The cooling apparatus of claim 1, wherein the coolant control apparatus further comprises a flow control valve associated with the facility coolant supply conduit, the at least one recirculation conduit being coupled in fluid communication with the facility coolant supply conduit between the flow control valve and an inlet to the coolant-cooled heat exchanger, and the controller controlling the flow control valve to control a flow of liquid facility coolant within the facility coolant supply conduit, and wherein the controller automatically adjusts the at least one liquid coolant pump and the flow control valve to, at least in part, ensure that the liquid facility coolant supplied to the coolant-cooled heat exchanger remains above the dew point temperature.

3. The cooling apparatus of claim 2, wherein the controller further controls the at least one liquid coolant pump and the flow control valve to, at least in part, ensure a sufficient flow of facility coolant to the coolant-cooled heat exchanger in combination with ensuring that the facility coolant supplied to the coolant-cooled heat exchanger remains above the dew point temperature.

4. The cooling apparatus of claim 1, wherein the coolant control apparatus further comprises a differential pressure sensor coupled between the facility coolant supply conduit and the facility coolant return conduit, the differential pressure sensor sensing a differential pressure between the facility coolant supply conduit and the facility coolant return conduit, and the sensed differential pressure facilitating maintaining, by the controller, facility coolant flow through the coolant-cooled heat exchanger.

5. The cooling apparatus of claim 4, wherein the differential pressure sensor is coupled between the facility coolant supply conduit and the facility coolant return conduit between where the at least one coolant recirculation conduit couples in fluid communication with the facility coolant supply conduit and an inlet to the coolant-cooled heat exchanger.

6. The cooling apparatus of claim 1, further comprising multiple coolant-cooled heat exchangers, each coolant-cooled heat exchanger being associated with a respective electronics rack of multiple electronics racks, wherein the coolant control apparatus controls recirculation of facility coolant through the at least one coolant recirculation conduit to, at least in part, ensure that facility coolant supplied to each coolant-cooled heat exchanger of the multiple coolant-cooled heat exchangers remains above the dew point temperature.

7. The cooling apparatus of claim 1, wherein the coolant control apparatus further comprises a flow control valve coupled in fluid communication with the facility coolant supply conduit, the at least one recirculation conduit being coupled in fluid communication with the facility coolant supply conduit between the flow control valve and an inlet to the coolant-cooled heat exchanger, and the controller controlling the flow control valve to control flow of facility coolant within the facility coolant supply conduit, and wherein the controller senses temperature of facility coolant supplied to the coolant-cooled heat exchanger and determines whether the sensed facility coolant temperature is below a lower set point temperature or above an upper set point temperature, and responsive to the facility coolant temperature being below the lower set point temperature, the controller automatically incrementally closes the flow control valve to provide less facility coolant flow therethrough, and responsive to the facility coolant temperature being above the upper set point temperature, the controller automatically incrementally opens the flow control valve to provide additional facility coolant flow therethrough.

8. The cooling apparatus of claim 7, further comprising a differential pressure sensor coupled to sense a pressure differential between the facility coolant supply conduit and the facility coolant return conduit, and wherein the controller determines whether the sensed pressure differential between the facility coolant supply conduit and facility coolant return conduit is less than a lower-pressure differential set point or above an upper-pressure differential set point, and responsive to the sensed pressure differential being below the lower-pressure differential set point, the controller automatically incrementally increases speed of the at least one liquid coolant pump, and responsive to the pressure differential being above the upper-pressure differential set point, the controller automatically incrementally decreases speed of the at least one liquid coolant pump.

9. The cooling apparatus of claim 1, wherein the controller automatically determines the dew point temperature based on a sensed ambient air temperature and a sensed relative humidity of ambient air.

10. The cooling apparatus of claim 9, wherein the controller periodically re-determines the dew point temperature based on a current, sensed ambient air temperature and a current, sensed relative humidity of the ambient air.

11. The cooling apparatus of claim 1, further comprising a shut off valve coupled in fluid communication with the facility coolant return conduit, wherein the at least one recirculation conduit is coupled in fluid communication with the facility coolant return conduit between the shut off valve and an outlet of the coolant-cooled heat exchanger, and wherein the controller controls the shut off valve at start up of the electronics rack to facilitate recirculation of facility coolant to ensure that the facility coolant supplied to the coolant-cooled heat exchanger remains above the dew point temperature.

12. A cooled electronics system comprising:
an electronics rack comprising an air inlet side and an air outlet side, wherein air passes through the electronics rack from the air inlet side to the air outlet side thereof; and
a cooling apparatus comprising:
an air-to-liquid heat exchanger associated with the electronics rack for cooling air passing through the electronics rack;
a coolant control apparatus, the coolant control apparatus comprising:
at least one coolant recirculation conduit coupled in fluid communication between a facility coolant supply conduit and a facility coolant return conduit, the facility coolant supply conduit facilitating a flow of liquid facility coolant to the air-to-liquid heat exchanger and the facility coolant return conduit facilitating exhausting of the liquid facility coolant from the air-to-liquid heat exchanger;
at least one liquid coolant pump associated with the at least one coolant recirculation conduit, the at least one liquid coolant pump facilitating controlled recirculation of facility coolant directly from the liquid facility coolant return conduit to the facility coolant supply conduit through the at least one coolant recirculation conduit;
at least one check valve within the at least one coolant recirculation conduit, the at least one check valve preventing backflow of the liquid facility coolant from the facility coolant supply conduit to the facility coolant return conduit through the at least one recirculation conduit; and
a controller, the controller monitoring a temperature of the liquid facility coolant supplied to the air-to-liquid heat exchanger, and controlling the at least one liquid coolant pump to control recirculation of the liquid facility coolant, via the at least one coolant recirculation conduit, from the facility coolant return conduit to the liquid facility coolant supply conduit to, at least in part, ensure that the facility coolant supplied to the air-to-liquid heat exchanger remains above a dew point temperature.

13. The cooled electronic system of claim 12, wherein the coolant control apparatus further comprises a flow control valve associated with the facility coolant supply conduit, the at least one recirculation conduit being coupled in fluid communication with the facility coolant supply conduit between the flow control valve and an inlet to the air-to-liquid heat exchanger, and the controller controlling the flow control valve to control a flow of facility coolant within the liquid facility coolant supply conduit, and wherein the controller automatically adjusts the at least one liquid coolant pump and the flow control valve to, at least in part, ensure a sufficient flow of liquid facility coolant to the air-to-liquid heat exchanger in combination with ensuring that the liquid facility coolant supplied to the air-to-liquid heat exchanger remains above the dew point temperature.

14. The cooled electronic system of claim 12, wherein the coolant control apparatus further comprises a differential pressure sensor coupled between the facility coolant supply conduit and the facility coolant return conduit, the differential pressure sensor sensing a differential pressure between the facility coolant supply conduit and the facility coolant return conduit, and thereby facilitating maintaining, by the controller, liquid facility coolant flow through the air-to-liquid heat exchanger, and wherein the differential pressure sensor is coupled between the facility coolant supply conduit and the facility coolant return conduit between where the at least one coolant recirculation conduit couples in fluid communication with the facility coolant supply conduit and an inlet to the air-to-liquid heat exchanger.

15. The cooled electronic system of claim 12, further comprising multiple air-to-liquid heat exchangers, each air-to-liquid heat exchanger being disposed at one of an air inlet side or an air outlet side of a respective electronics rack of multiple electronics racks, wherein air flows through each electronics rack from the air inlet side to the air outlet side thereof, and the coolant control apparatus controls recirculation of liquid facility coolant through the at least one coolant recirculation conduit to, at least in part, ensure that facility coolant supplied to each air-to-liquid heat exchanger of the multiple air-to-liquid heat exchangers remains above the dew point temperature.

16. The cooled electronic system of claim 12, wherein the controller automatically determines the dew point temperature based on a sensed ambient air temperature and a sensed relative humidity of ambient air.

17. The cooled electronic system of claim 12, further comprising a shut off valve coupled in fluid communication with the facility coolant return conduit, wherein the at least one recirculation conduit is coupled in fluid communication with the facility coolant return conduit between the shut off valve and an outlet of the air-to-liquid heat exchanger, and wherein the controller controls the shut off valve at start up of the electronics rack to facilitate recirculation of liquid facility coolant to ensure that the facility coolant supplied to the coolant-cooled heat exchanger remains above the dew point temperature.

* * * * *